(12) United States Patent
Chihaya et al.

(10) Patent No.: US 11,715,671 B2
(45) Date of Patent: Aug. 1, 2023

(54) FILM FORMING SYSTEM, MAGNETIZATION CHARACTERISTIC MEASURING DEVICE, AND FILM FORMING METHOD

(71) Applicant: TOKYO ELECTRON LIMITED, Tokyo (JP)

(72) Inventors: Hiroaki Chihaya, Nirasaki (JP); Einstein Noel Abarra, Tokyo (JP); Shota Ishibashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 491 days.

(21) Appl. No.: 17/021,846

(22) Filed: Sep. 15, 2020

(65) Prior Publication Data

US 2021/0082777 A1 Mar. 18, 2021

(30) Foreign Application Priority Data

Sep. 18, 2019 (JP) .................................. 2019-169296

(51) Int. Cl.
*H01L 21/66* (2006.01)
*G01R 33/032* (2006.01)
*G01N 27/72* (2006.01)
*C23C 14/56* (2006.01)
*H10N 50/01* (2023.01)

(52) U.S. Cl.
CPC ............ *H01L 22/14* (2013.01); *C23C 14/566* (2013.01); *G01N 27/72* (2013.01); *G01R 33/032* (2013.01); *H10N 50/01* (2023.02)

(58) Field of Classification Search
CPC .. G01R 33/032; G01R 33/24; G01R 33/0325; G01N 2021/218; G01N 2021/8848; H01L 21/203
See application file for complete search history.

(56) References Cited

U.S. PATENT DOCUMENTS

2008/0274567 A1* 11/2008 Dahmani ............... B82Y 25/00
257/E21.001
2008/0284419 A1* 11/2008 Ikeda .................. G01R 33/1284
324/207.21
(Continued)

FOREIGN PATENT DOCUMENTS

JP    H03-163376 A    7/1991
JP    2015-126221 A   7/2015
(Continued)

*Primary Examiner* — Jaehwan Oh
(74) *Attorney, Agent, or Firm* — Fenwick & West LLP

(57) ABSTRACT

A film forming system for forming a magnetic film is provided. The film forming system includes a processing module configured to form the magnetic film on a substrate, a magnetization characteristic measuring device configured to measure magnetization characteristics of the magnetic film formed on the substrate in the processing module, and a transfer unit configured to transfer the substrate between the processing module and the magnetization characteristic measuring device. The magnetization characteristic measuring device includes a magnetic field applying mechanism having a permanent magnet magnetic circuit configured to apply a magnetic field to the substrate and adjust the magnetic field to be applied to the substrate, and a detector configured to detect magnetization characteristics of the substrate.

20 Claims, 13 Drawing Sheets

(56) References Cited

U.S. PATENT DOCUMENTS

| | | | |
|---|---|---|---|
| 2009/0314740 A1* | 12/2009 | Ikemoto | H01F 41/308 |
| | | | 216/22 |
| 2010/0133092 A1* | 6/2010 | Mashimo | H01L 21/02266 |
| | | | 204/192.21 |
| 2010/0170017 A1* | 7/2010 | Heidmann | G01R 33/032 |
| | | | 324/244.1 |
| 2011/0203734 A1* | 8/2011 | Koji | H01J 37/3426 |
| | | | 204/192.15 |
| 2017/0346000 A1* | 11/2017 | Eissa | H01F 41/046 |
| 2020/0126873 A1* | 4/2020 | Noh | H01F 10/3286 |
| 2021/0109168 A1* | 4/2021 | Seko | G01R 33/0325 |
| 2021/0405086 A1* | 12/2021 | Te Velthuis | G01N 21/21 |

FOREIGN PATENT DOCUMENTS

| | | |
|---|---|---|
| JP | 2015-137414 A | 7/2015 |
| JP | 6160614 B2 | 7/2017 |
| KR | 10-2007-0026068 A | 3/2007 |

\* cited by examiner

FILM FORMING SYSTEM, MAGNETIZATION CHARACTERISTIC MEASURING DEVICE, AND FILM FORMING METHOD

CROSS-REFERENCE TO RELATED APPLICATION

This application claims priority to Japanese Patent Application No. 2019-169296, filed on Sep. 18, 2019, the entire contents of which are incorporated herein by reference.

TECHNICAL FIELD

The present disclosure relates to a film forming system, a magnetization characteristic measuring device, and a film forming method.

BACKGROUND

A magnetic tunnel junction (MTJ) device used in a magnetoresistive random access memory (MRAM) is configured as a laminated film having two magnetic films and a tunnel barrier film made of an insulating film provided between the two magnetic films. In the MTJ device, the electric resistance is low when the magnetization directions of the two magnetic films are identical to each other, and the electric resistance is high when the magnetization directions of the two magnetic films are different from each other. The MTJ element is formed by sequentially forming the films described above on a substrate by sputtering. As an example of a processing system for forming a laminated structure of magnetic films such as the MTJ device, a processing system in which a plurality of processing modules are connected to a vacuum transfer chamber to sequentially perform necessary processes for, e.g., film formation has been suggested (see, e.g., Japanese Patent No. 6160614).

In a device such as the MTJ device in which the magnetization direction of the magnetic film is changed, the magnetization characteristics of the magnetic film are significant. Thus, it is required to be aware of whether or not the magnetic film has the desired magnetization characteristics. As a technique for measuring the magnetization characteristics of such a magnetic film, Japanese Patent Application Publication No. H03-163376 discloses a technique using an electromagnet.

The present disclosure provides a film forming system capable of measuring the magnetization characteristics of a formed magnetic film, and a magnetization characteristic measuring device used therein and a film forming method used therefor.

SUMMARY

In accordance with an aspect of the present disclosure, there is provided a film forming system for forming a magnetic film, including: a processing module configured to form the magnetic film on a substrate; a magnetization characteristic measuring device configured to measure magnetization characteristics of the magnetic film formed on the substrate in the processing module; and a transfer unit configured to transfer the substrate between the processing module and the magnetization characteristic measuring device. The magnetization characteristic measuring device includes a magnetic field applying mechanism having a permanent magnet magnetic circuit configured to apply a magnetic field to the substrate and adjust the magnetic field to be applied to the substrate, and a detector configured to detect magnetization characteristics of the substrate.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in Detail with Reference to the Accompanying Drawings.

Film Forming System

Figure 1:
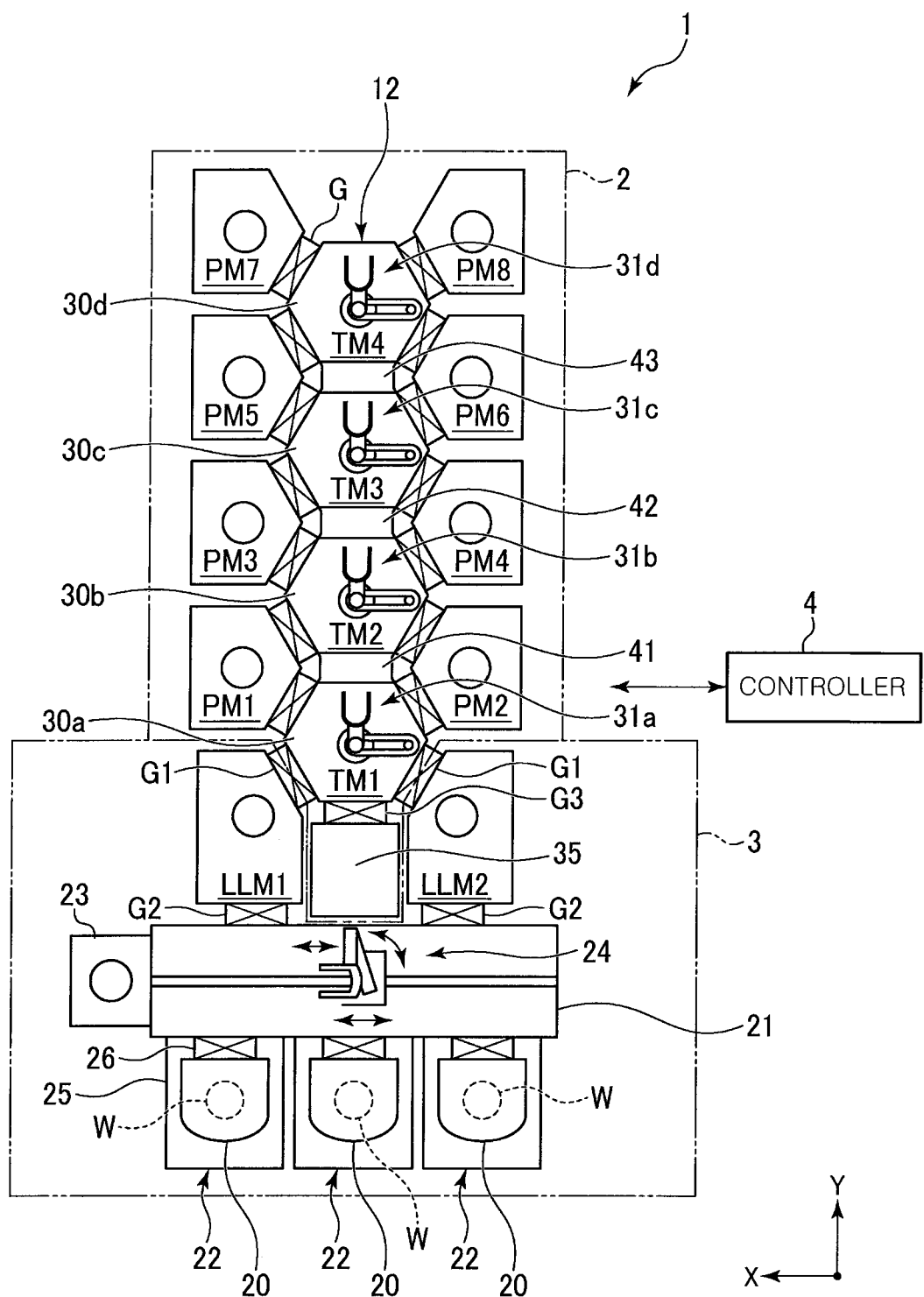
FIG. 1 is a plan view schematically showing a film forming system according to an embodiment.

FIG. 1 is a plan view schematically showing a film forming system according to an embodiment.

The film forming system 1 includes a processing section 2 for performing a plurality of processes including film formation of a magnetic film, a loading/unloading section 3 for holding a plurality of substrates and loading and unloading the substrates into and from the processing section 2, and a controller 4. The substrate is not particularly limited, but may be, for example, a semiconductor wafer (hereinafter simply referred to as "wafer").

The processing section 2 includes multiple processing modules (eight processing modules in this example) PM1 to PM8 configured to perform vacuum processes including a film forming process on the substrate W, a transfer unit 12 including multiple transfer modules TM1 to TM4 for sequentially transferring the substrate W to the multiple processing modules PM1 to PM8, and a magnetization characteristic measuring device 35 configured to measure the magnetization characteristics of a formed magnetic film.

Figure 2:
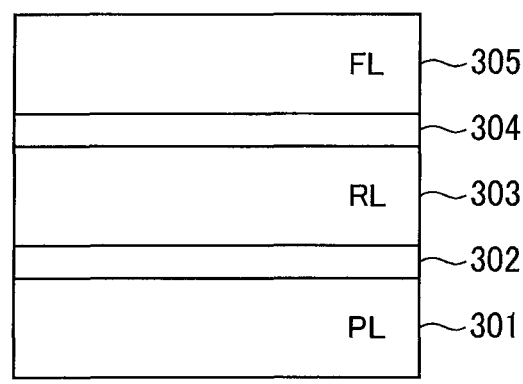
FIG. 2 a cross-sectional view showing a structure of an MTJ device that is an example of a laminated film to be formed by the film forming system of FIG. 1.

The processing modules PM1 to PM8 are provided for forming a plurality of films including a magnetic film on the substrate. For example, the processing modules PM1 to PM8 are configured to form a laminated film for an MTJ device used in an MRAM device. As shown in FIG. 2, the MTJ device is formed of a laminated film in which a pinned layer (PL) 301, a spacer layer 302, a reference layer (RL) 303, a dielectric layer 304, and a free layer (FL) 305 are sequentially laminated.

The free layer 305 is a ferromagnetic film whose magnetization is easy to reverse (switch), the reference layer 303 is a ferromagnetic film whose magnetization is hard to reverse, and the dielectric layer 304 is a tunnel barrier film. The resistance of the MTJ device is determined based on the relative angle between the magnetization of the free layer 305 and the magnetization of the reference layer 303, and the resistance is the minimum value when the magnetization directions are parallel with each other and the maximum value when the magnetization directions are anti-parallel with each other. The pinned layer 301 is a ferromagnetic film and is anti-ferromagnetically coupled to the reference layer 303 via the non-magnetic spacer layer 302. The pinned layer 301 pins the magnetization of the reference layer 303 in the opposite direction. The MTJ device preferably has perpendicular magnetic anisotropy. Each of the pinned layer 301, the reference layer 303, and the free layer 305 may be formed by laminating a plurality of films. For example, the pinned layer 301 has a laminated structure of Co and Pt or a laminated structure of Co and Ni. Further, the reference layer 303 is a ferromagnetic film having a high coercive force and formed of a multi-layer structure such as Co/Ni/CoFeB, Co/Pt/CoFeB or Co/M/CoFeB (M: non-magnetic metal thin film). The free layer 305 is a ferromagnetic film having a low coercive force and formed of, e.g., Co/Fe/B.

The dielectric layer 304 serving as the tunnel barrier film is formed of, for example, a MgO film, and the spacer layer 302 is formed of, for example, a Ru film or an Ir film. The thickness of the spacer layer 302 is optimized to obtain an exchange coupling field for measuring the magnetization characteristics between the pinned layer 301 and the reference layer 303.

Each of the processing modules is configured to perform a film forming process, a pre-cleaning process, an oxidizing process, a heating process, a cooling process, and the like. The processing module(s) that performs the film forming process is configured to form one or a plurality of films by sputtering. Although eight processing modules have been illustrated in the present embodiment, the number of processing modules is not limited thereto and may be set to an arbitrary number depending on the process.

The transfer modules TM1 to TM4 respectively include containers 30a, 30b, 30c, and 30d, each of which has a hexagonal planar shape that is maintained in a vacuum atmosphere, and transfer mechanisms 31a, 31b, 31c, and 31d respectively provided in the containers 30a, 30b, 30c, and 30d. Delivery chambers 41, 42, and 43 serving as transfer buffers are provided between the transfer mechanisms of the transfer modules TM1 to TM4. The containers 30a, 30b, 30c, and 30d of the transfer modules TM1 to TM4 communicate with each other.

The transfer unit 12 includes the multiple transfer modules TM1 to TM4 arranged in a row in a Y direction in FIG. 1, and four of eight processing modules PM1 to PM8 are connected to one of both sides of the transfer unit 12 and the other four of eight processing modules PM1 to PM8 are connected to the other one of both sides of the transfer unit 12 through gate valves G (details will be described later). The gate valves G of the processing modules PM1 to PM8 are open when the transfer mechanisms of the transfer modules access the processing modules and closed when the processing is performed. Further, a magnetization characteristic measuring device 35 is connected to the container 30a of the transfer unit 12 through a gate valve G3.

The loading/unloading section 3 is connected to one end of the processing section 2. The loading/unloading section 3 includes an atmospheric transfer chamber (EFEM; equipment front end module) 21, and three load ports 22, an aligner module 23, and two load lock modules LLM1 and LLM2 that are connected to the atmospheric transfer chamber 21. The loading/unloading section 3 further includes a transfer device 24 disposed in the atmospheric transfer chamber 21.

The atmospheric transfer chamber 21 has a rectangular parallelepiped shape whose longitudinal direction is the X direction in FIG. 1. The three load ports 22 are arranged on one long sidewall of the atmospheric transfer chamber 21 away from the processing section 2. Each of the load ports 22 has a stage 25 and a transfer port 26. A FOUP 20, which is a substrate container for storing a plurality of substrates, is placed on the stage 25. The FOUP 20 on the stage 25 is hermetically connected to the atmospheric transfer chamber 21 via the transfer port 26.

The aligner module 23 is connected to one short sidewall of the atmospheric transfer chamber 21. The substrate W is aligned in the aligner module 23.

The two load lock modules LLM1 and LLM2 are provided to enable the transfer of the substrate W between the atmospheric transfer chamber 21 maintained at atmospheric pressure and the transfer unit 12 maintained in a vacuum atmosphere. The inner pressure of each of the two load lock modules LL1 and LLM2 can be switched between the atmospheric pressure and the same vacuum level as that of the transfer unit 12. Each of the two load lock modules LLM1 and LLM2 has two transfer ports. One transfer port is connected to the long sidewall of the atmospheric transfer chamber 21 on the processing section 2 side via a gate valve G2. The other transfer port is connected to the container 30a of the transfer unit 12 in the processing section 2 via a gate valve G1.

The load lock module LLM1 is used when the substrate W is transferred from the loading/unloading section 3 to the processing section 2, and the load lock module LLM2 is used when the substrate W is transferred from the processing section 2 to the loading/unloading section 3. Further, the load lock modules LLM1 and LLM2 may perform processing such as degassing.

The transfer device 24 in the atmospheric transfer chamber 21 has an articulated structure and is configured to transfer the substrate W to the FOUP 20 on the load port 22 and the load lock modules LLM1 and LLM2. Specifically, the transfer device 24 extracts an unprocessed substrate W from the FOUP 20 of the load port 22 and transfers the substrate W to the load lock module LLM1. Further, the transfer device 24 receives a processed substrate W transferred to the load lock module LLM2 from the processing section 2 and transfers the substrate W to the FOUP 20 of the load port 22. Although an example in which one pick of the transfer device 24 receives the substrate W is illustrated in FIG. 1, two picks may be employed.

In the processing section 2, the processing modules PM1, PM3, PM5, and PM7 are arranged on one side of the transfer unit 12 in order from the load lock module LLM1 side, and the processing modules PM2, PM4, PM6, and PM8 are arranged on the other side of the transfer unit 12 in order from the load lock module LLM2 side. Further, in the transfer unit 12, the transfer modules TM1, TM2, TM3, and TM4 are arranged in order from the load lock module LLM1 and LLM2 side.

The transfer mechanism 31a of the transfer module TM1 can access the load lock modules LLM1 and LLM2, the processing modules PM1 and PM2, the delivery chamber 41, and the magnetization characteristic measuring device 35. The transfer mechanism 31b of the transfer module TM2 can access the processing modules PM1, PM2, PM3, and PM4, and the delivery chambers 41 and 42. The transfer mechanism 31c of the transfer module TM3 can access the processing modules PM3, PM4, PM5, and PM6, and the delivery chambers 42 and 43. The transfer mechanism 31d of the transfer module TM4 can access the processing modules PM5, PM6, PM7, and PM8, and the delivery chamber 43.

The magnetization characteristic measuring device 35 is configured to measure the magnetization characteristics of a laminated film including magnetic films, for example, the magnetization characteristics of each magnetic film of the laminated film for the MTJ device after each magnetic film is formed, or the magnetization characteristics of the laminated film. The magnetization characteristic measuring device 35 is configured to apply a desired magnetic field strength to the substrate W. Then, the magnetic field-applied portion of the substrate W is irradiated with a spot-like laser light, and the rotation (Kerr rotation angle) of the polarization plane of the reflected light is measured to then measure the magnetization characteristics of the laser light irradiated portion. The magnetic field strength can be adjusted by controlling a distance between magnetic poles, rotating a dipole magnet, and changing a direction of the magnetic flux with a shunt member. The magnetization characteristic measuring device 35 measures the magnetization characteristics of each magnetic film in situ at the time when each magnetic film is formed in the processing module or at the time when the formation of the laminated film for the MTJ device is completed. The position of the magnetization characteristic measuring device 35 is not limited to the position shown in the example of FIG. 1, and a plurality of magnetization characteristic measuring devices 35 may be provided. Details of the magnetization characteristic measuring device 35 will be described later.

Since the transfer device 24 and the transfer modules TM1 to TM4 of the transfer unit 12 are configured in the above manner, the substrate W extracted from the FOUP 20 is serially transferred in one direction along a substantially U-shaped path in the processing section 2, i.e., in the order of the processing modules PM1, PM3, PM5, PM7, PM8, PM6, PM4, and PM2, so that the substrate W is processed in each processing modules. Then, the substrate W is returned to the FOUP 20.

The controller 4 includes and controls individual components of the film forming system 1, for example, the transfer modules TM1 to TM4 (transfer mechanisms 31a to 31d), the transfer device 24, the processing modules PM1 to PM8, the load lock modules LLM1 and LLM2, the transfer unit 12, the gate valves G, G1, G2, and the like. The controller 4 includes a computer that includes a main controller having a CPU, an input device, an output device, a display device, and a storage device. The storage device includes a computer-readable storage medium in which a processing recipe is stored. The main controller causes the film forming system 1 to execute a predetermined operation based on the processing recipe retrieved from the storage medium.

In the film forming system 1 configured as described above, first, the substrate W is extracted from the FOUP 20 on the load port 22 by the transfer device 24 and transferred to the aligner module 23. After the substrate W is aligned in the aligner module 23, the substrate W is extracted by the transfer device 24 and transferred to the load lock module LLM1. Here, the load lock module LLM1 is maintained at atmospheric pressure, and is evacuated after receiving the substrate W.

Then, the substrate W is extracted from the load lock module LLM1 by the transfer mechanism 31a of the transfer module TM1 in the transfer unit 12. The extracted substrate W is transferred to the processing module PM1 by the transfer mechanism 31a and a predetermined process is executed in the processing module PM1.

After the process in the processing module PM1 is completed, the gate valve G on the unloading side of the processing module PM1 is open. Then, the substrate W is unloaded by the transfer mechanism 31b of the transfer module TM2. The unloaded substrate W is transferred to the processing module PM3 by the transfer mechanism 31b and a predetermined process is executed in the processing module PM3.

After the process in the processing module PM3 is completed, the gate valve G on the unloading side of the processing module PM3 is open. Then, the substrate W is unloaded by the transfer mechanism 31c of the transfer module TM3. The unloaded substrate W is transferred to the processing module PM5 by the transfer mechanism 31c and a predetermined process is executed in the processing module PM5.

After the process in the processing module PM5 is completed, the gate valve G on the unloading side of the processing module PM5 is open. Then, the substrate W is unloaded by the transfer mechanism 31d of the transfer module TM4. The unloaded substrate W is transferred to the processing module PM7 by the transfer mechanism 31d and a predetermined process is executed in the processing module PM7.

After the process in the processing module PM7 is completed, the gate valve G on the unloading side of the processing module PM7 is open. Then, the substrate W is unloaded by the transfer mechanism 31d of the transfer module TM4. The unloaded substrate W is transferred to the processing module PM8 by the transfer mechanism 31d and a predetermined process is executed in the processing module PM8.

Thereafter, the substrate W is sequentially transferred to the processing modules PM6, PM4, and PM2 by the transfer mechanisms 31c, 31b, and 31a of the transfer modules TM3, TM2, and TM1 so that the substrate W is sequentially subjected to predetermined processes in the processing modules PM6, PM4, and PM2.

After the process in the processing module PM2 is completed, the substrate W is transferred to the load lock module LLM2 by the transfer mechanism 31a. Here, the load lock module LLM2 is maintained in a vacuum atmosphere and open to the atmospheric atmosphere after receiving the substrate W. Next, the substrate W in the load lock module LLM2 is transferred into the FOUP 20 of the load port 22 by the transfer device 24.

As described above, the substrate W can be sequentially and serially transferred along the U-shape arrangement of a plurality of processing modules and a series of the film forming process can be performed.

During the series of the film forming process described above, when it is necessary to confirm whether or not the magnetic film has the desired characteristics after the magnetic film is formed, the substrate W is transferred to the magnetization characteristic measuring device 35 by the transfer mechanism of each transfer module in the transfer unit 12 after the film formation of the target film is completed. Then, the magnetization characteristics of the substrate W are measured. Here, before the measurement, heat treatment at about 400° C. for several seconds to several minutes and cooling treatment to room temperature may be performed.

Magnetization Characteristic Measuring Device

Next, the magnetization characteristic measuring device 35 will be described in detail. In the following description, examples of the structure of the magnetization characteristic measuring device 35 will be specifically described.

First Example

Figure 3:
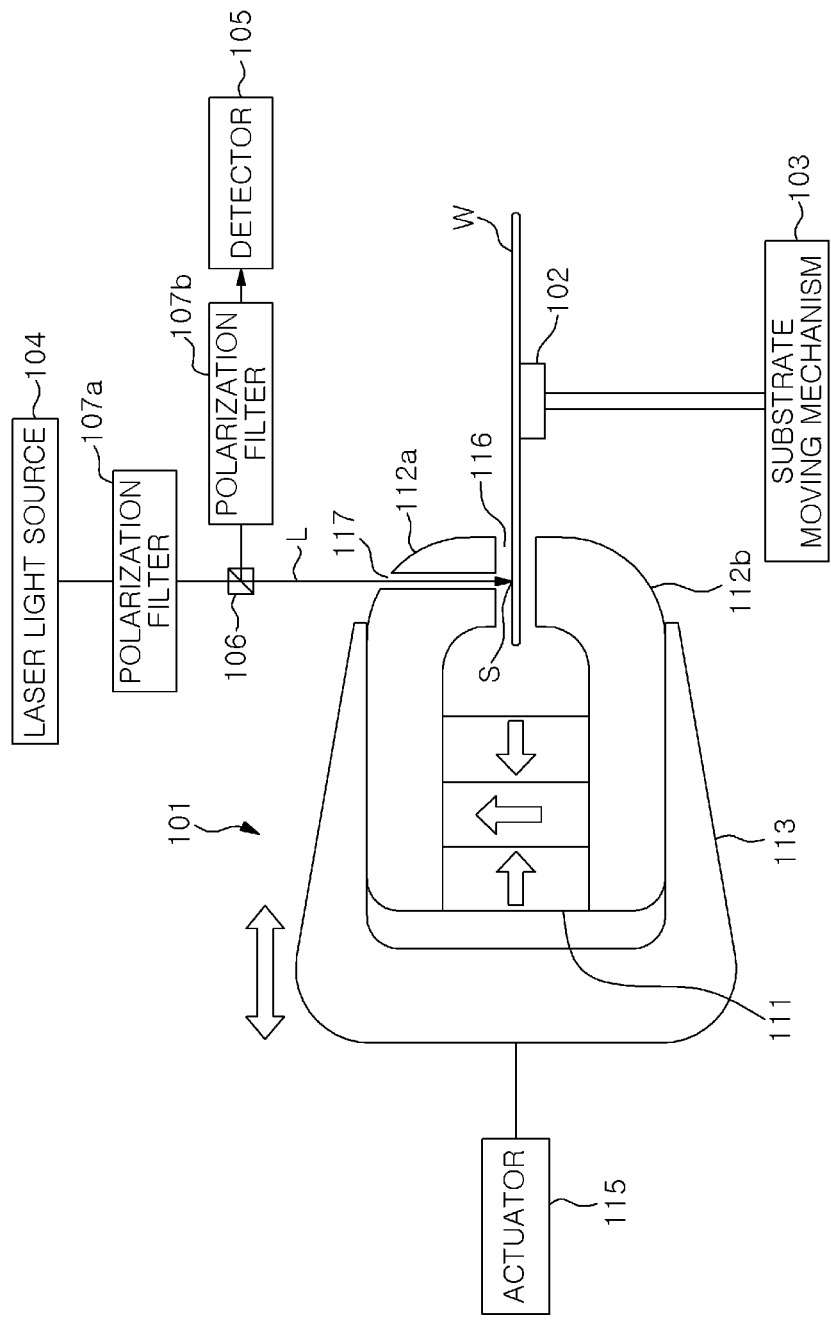
FIG. 3 is a cross-sectional view showing a schematic configuration of a first example of a magnetization characteristic measuring device.

FIG. 3 is a cross-sectional view showing a schematic configuration of a first example of the magnetization characteristic measuring device.

The magnetization characteristic measuring device of the first example includes a magnetic field applying mechanism 101 provided in a chamber (not shown) maintained in a vacuum atmosphere, a substrate support 102 for placing thereon the substrate W in the chamber, a substrate moving mechanism 103 for moving the substrate W, an optical system including a laser light source 104, and a detector 105.

The magnetic field applying mechanism 101 is configured to apply a magnetic field with a specific range to the substrate W. The magnetic field applying mechanism 101 includes a Halbach array magnet 111 that is a permanent magnet member configured to generate a magnetic field, a pair of yokes 112a and 112b configured to guide the magnetic flux from the Halbach array magnet 111, and a shunt yoke 113 configured to adjust the magnetic field. The yokes 112a and 112b and the shunt yoke 113 are made of magnetic materials. The Halbach array magnet 111, the yokes 112a and 112b, and the shunt yoke 113 constitute a permanent magnet magnetic circuit. A gap 116 is formed between the yokes 112a and 112b, and a magnetic field is generated in the gap 116. The substrate W is horizontally inserted into the gap 116, and a magnetic field perpendicular to the substrate W is applied. The shunt yoke 113 is provided outside the yokes 112a and 112b and configured to be linearly moved by the actuator 115. By moving the shunt yoke 113, the distance between the shunt yoke 113 and the Halbach array magnet 111 changes, so that the magnetic field strength applied from the Halbach array magnet 111 to the gap 116 through the yokes 112a and 112b is controlled. Since the magnetic field is linearly changed by the shunt yoke 113, the shunt yoke 113 may be a tapered shape as shown in FIG. 3.

The Halbach array magnet 111 is selected so that a magnetic field of a wide range of, e.g., 0 to 15 kOe (kilo-oersted) can be applied to measure each magnetic film of the laminated film such as the laminated film for the MTJ device formed on the substrate W. The Halbach array magnet 111 maximizes the magnetic field strength in a specific direction by optimizing the magnetic poles directions, and, in the example of FIG. 3, is configured by combining a plurality of permanent magnets having different magnetic pole directions. However, the permanent magnet member is not limited to the Halbach array magnet as long as a desired magnetic field strength can be obtained.

A hole 117 is formed through the yoke 112a perpendicularly to the surface of the substrate W placed on the substrate support 102. Laser light L from the laser light source 104 becomes polarized light by a polarization filter 107a and is irradiated on a spot S of the substrate W through the hole 117. Then, the reflected light from the substrate W is guided to the detector 104 through a half mirror 106 and a polarization filter 107b. The polarization plane of the reflected light from the spot S rotates in proportion to the magnitude of the magnetization due to the Kerr effect. Therefore, the magnetization characteristics of the spot S of the substrate W can be measured by detecting a signal (for example, current) according to the rotation angle (Kerr rotation angle) with the detector 105. For transmitting the laser light, for example, a concentric fiber can be used. The laser light source 104, the polarization filters 107a and 107b, and the half mirror 106 form the optical system. However, the configuration of the optical system is not limited thereto.

The substrate moving mechanism 103 is configured to move the substrate W to change the position of the spot S irradiated with the laser light L. In the example of FIG. 3, the substrate W is rotated together with the substrate support 102 while the substrate W is eccentrically supported with respect to the substrate support 102. Thus, the magnetization characteristics at a desired radial position of the substrate W can be measured. The substrate support 102 may have an electrostatic chuck that electrostatically attracts and holds the substrate W.

For the determination of the measured magnetization characteristics, for example, the magnetization characteristics of the magnetic film to be measured are stored in the storage device of the controller 4, and the measured magnetization characteristics are compared with the stored magnetization characteristics to determine whether the measured magnetization characteristics are within the allowable range. If the measured magnetization characteristics are outside the allowable range, such substrate may be rejected, for example.

Figure 4:
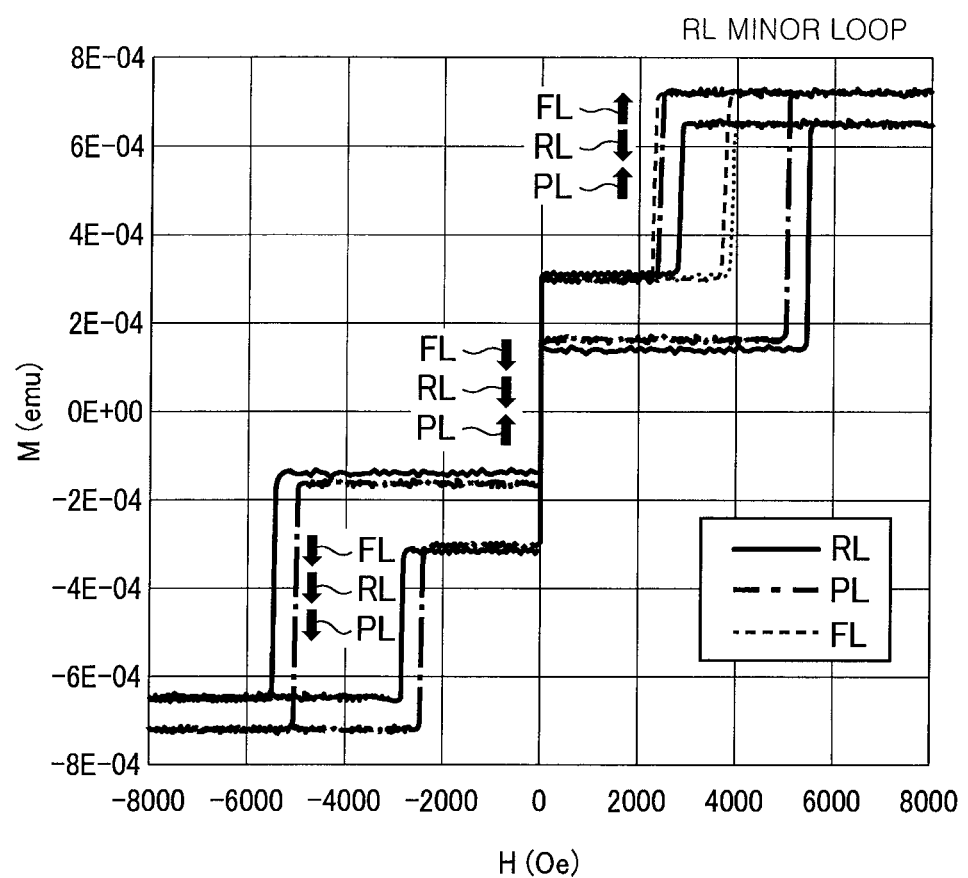
FIG. 4 shows an example of a magnetization curve (hysteresis curve) of the MTJ device shown in FIG. 2.

Next, an example of the determination of the magnetization characteristics will be described with reference to FIG. 4. FIG. 4 shows an example of a magnetization curve (hysteresis curve) of the MTJ device shown in FIG. 2 that shows the perpendicular magnetic anisotropy. Here, the magnetization characteristics are determined based on the relationship shown in FIG. 4. The magnetization curve in FIG. 4 is substantially point-symmetrical about H=0 and M=0. As shown in FIG. 4, this magnetization curve has three distinctive portions in each of which the magnetization changes rapidly with changes of the magnetic field. FIG. 4 also shows the magnetization directions of the respective layers in each portion where the magnetization changes rapidly. The increase of magnetization near the zero magnetic field corresponds to the magnetization switching (magnetization reversal) of the free layer 305, and the increase of magnetization near the high magnetic field corresponds to the magnetization switching of the pinned layer 301. Further, the decrease of magnetization near the intermediate magnetic field corresponds to the magnetization switching of the reference layer 303.

Therefore, it is possible to determine whether or not the desired magnetization characteristics are obtained by changing the magnetic field at the portion where the distinctive magnetization change of the magnetic film forming each layer occurs and measuring the magnetization characteristics of the magnetic film. In other words, the magnetization characteristics of the individual layers (magnetic films) can be measured by applying magnetic fields with different ranges to the pinned layer 301, the reference layer 303, and the free layer 305. Therefore, a permanent magnet member having magnetic fields of different magnitudes for the magnetic films of the individual layers may be used.

When a laminated film having magnetic films such as an MTJ device is formed, it is important to confirm in situ whether or not a desired film is formed. This is because an inspection performed after the completion of the film forming process may cause waste from performing unnecessary processing and discarding the substrate even if a defect is detected in the inspection since the subsequent film formation is already performed. In order to confirm whether or not the desired film is formed, a measuring the film thickness may be considered. However, it is difficult to determine the formation of the desired magnetic film from the film thickness.

Therefore, in the embodiment, the magnetization characteristic measuring device 35 is incorporated in the film forming system 1 to measure the magnetization characteristics of the magnetic film in situ.

Conventionally, as an example of the magnetization characteristic measuring device, a device that applies a magnetic field using an electromagnet as described in Japanese Patent Application Publication No. H03-163376 is generally used. When the magnetic field is applied using an electromagnet, the magnetic field can be easily adjusted. However, the device becomes large in size, so that it is difficult to install such a device in the film forming system due to a large space requirement and magnetic field leakage. Further, when the electromagnet is used, there is a problem that a large amount of electric power is required and a large amount of heat is generated.

On the other hand, in the magnetization characteristic measuring device of the present embodiment, a permanent magnet member (Halbach array magnet 111) is used for the magnetic field applying mechanism 101, so that the magnetic field strength applied to the gap 116 can be controlled by the permanent magnet magnetic circuit. Therefore, the device can be downsized and there is no problem of space or the magnetic field leakage. Accordingly, it is possible to measure the magnetization characteristics in situ by incorporating the device into the film forming system 1. Consequently, it is possible to measure the magnetization characteristics immediately after forming the magnetic films to confirm whether or not the desired characteristics are obtained, so that the waste of processing and substrates can be reduced by detecting the defects before performing all the processes.

Second Example

Figure 5:
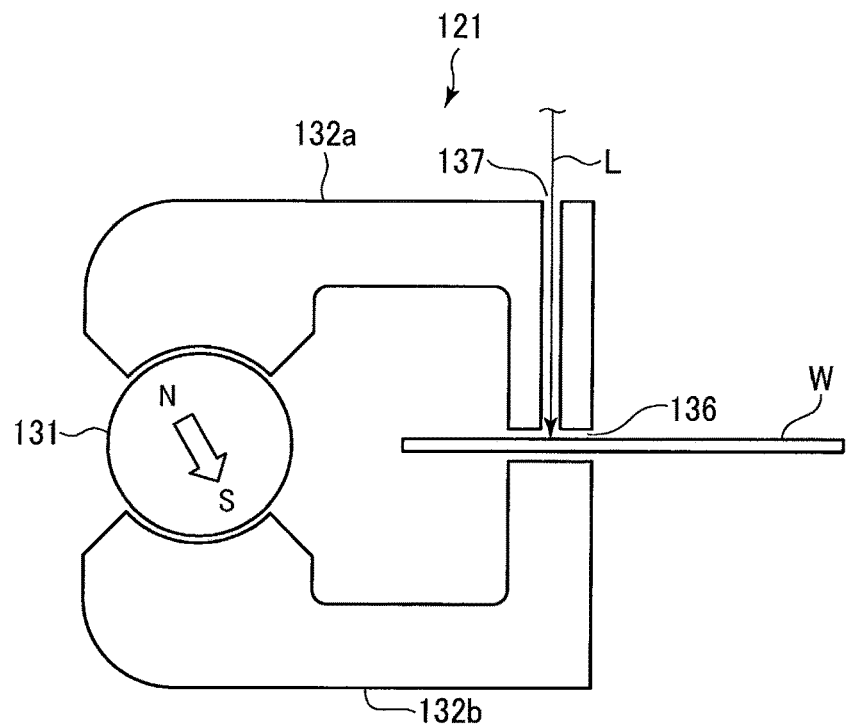
FIG. 5 is a cross-sectional view showing a schematic configuration of a magnetic field applying mechanism in a second example of the magnetization characteristic measuring device.

FIG. 5 is a cross-sectional view showing a schematic configuration of a magnetic field applying mechanism in a second example of the magnetization characteristic measuring device.

The magnetization characteristic measuring device of the second example is configured similarly to that of the first example except that it has a magnetic field applying mechanism 121 instead of the magnetic field applying mechanism 101 of the first example.

The magnetic field applying mechanism 121 of the second example includes a rotatable dipole magnet 131 that is a permanent magnet member configured to generate a magnetic field, and a pair of yokes 132a and 132b configured to guide the magnetic flux from the dipole magnet 131. The rotatable dipole magnet 131 and the yokes 132a and 132b constitutes the permanent magnet magnetic circuit. A gap 136 is formed between the yokes 132a and 132b, and a magnetic field is applied to the gap 136. Then, the magnetic field is applied to the substrate W by inserting the substrate W into the gap 136. The dipole magnet 131 that is the permanent magnet member is rotated by a rotating mechanism (not shown) to control the magnetic field strength applied to the gap 136 through the yokes 132a and 132b. The maximum magnetic field strength is obtained when the north-south pole direction is vertical, and the magnetic field strength is almost zero when the north-south pole direction is horizontal. As in the first example, a hole 137 through which the laser light L passes is formed through the yoke 132a. Further, a magnetic field is applied to the gap 136 and the substrate W is irradiated with laser light. Then, the magnetization characteristics are measured by measuring the Kerr rotation angle of the reflected light.

By using the rotatable dipole magnet 131 as the permanent magnet member as in the second example, it is advantageous in that a magnetic field in the vicinity of 0 can be accurately applied in addition to the effect of the first example. Therefore, it is possible to apply a highly accurate magnetic field when measuring the magnetization of the free layer, which is switched in the vicinity of the magnetic field of 0.

Figure 6:
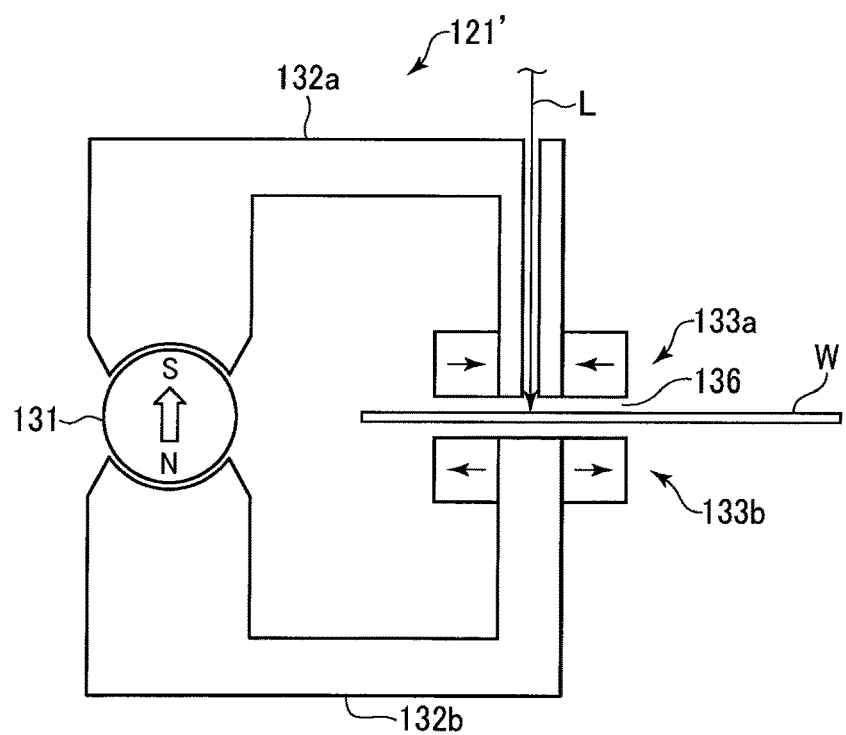
FIG. 6 is a cross-sectional view showing a schematic configuration of a magnetic field applying mechanism used in a modification of the second example.
Figure 7:
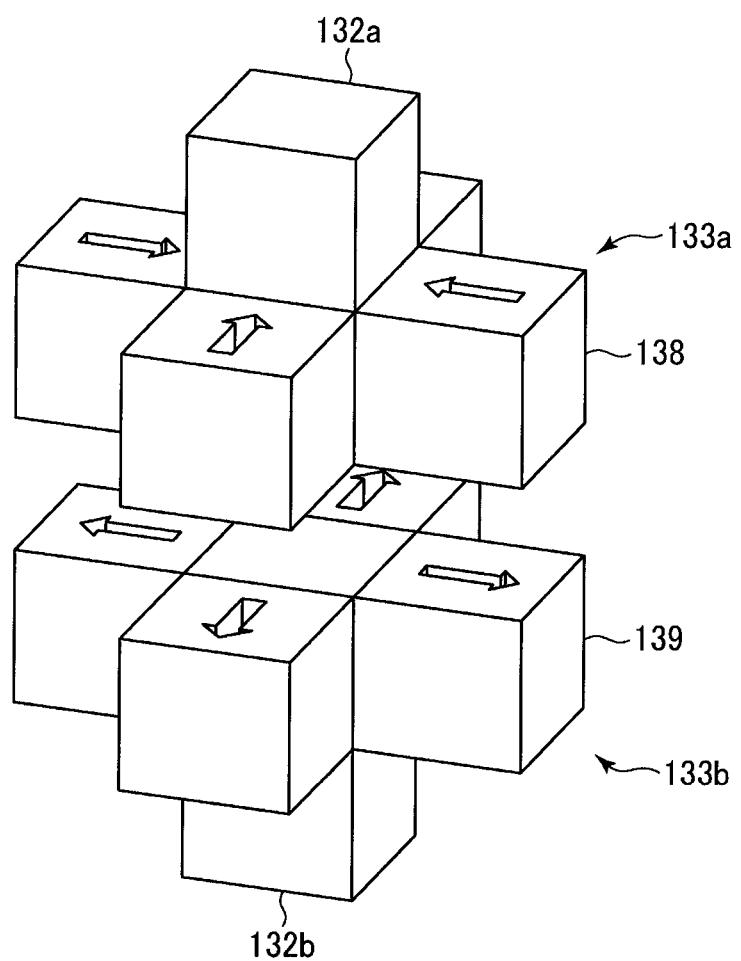
FIG. 7 is a perspective view showing a Halbach array magnet used in the magnetic field applying mechanism of FIG. 6.

FIG. 6 is a modification of the second example and is a cross-sectional view showing a magnetic field applying mechanism 121' in which a pair of Halbach array magnets 133a and 133b are further added to the magnetic field applying mechanism 121 of FIG. 5. The Halbach array magnets 133a and 133b are provided at the ends of the yokes 132a and 132b, which face each other in the gap 136, so that the magnetic field strength applied to the gap 136 can be adjusted. For example, the magnetic field strength applied to the gap 136 can be further increased. As shown in FIG. 7, for example, the Halbach array magnet 133a includes four magnets 138 provided at the end of the yoke 132a and the Halbach array magnet 133b includes four magnets 139 provided at the end of the yoke 132b. By adjusting the magnetization directions of these magnets, a magnetic field having a desired direction and strength is applied to the gap 136.

Figure 8:
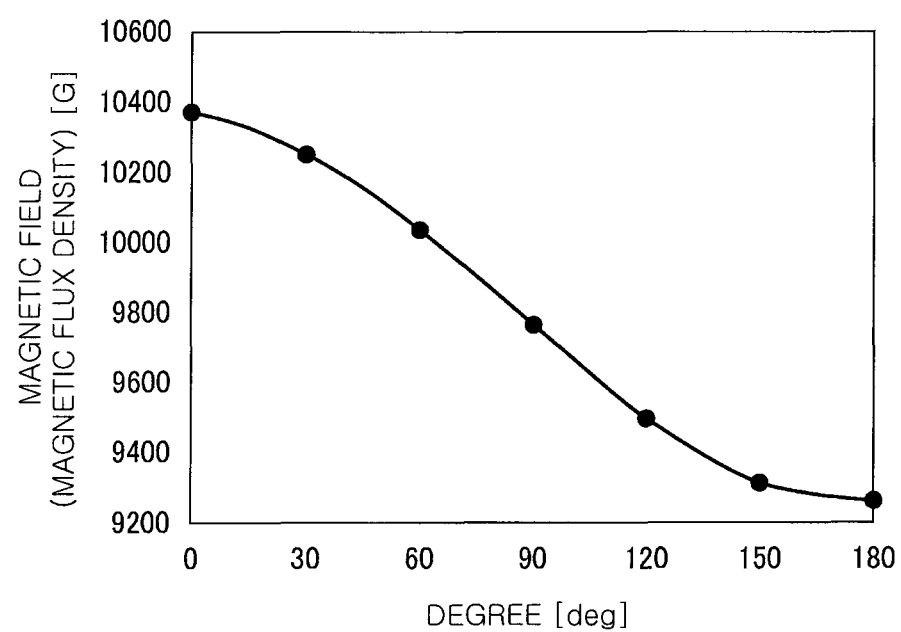
FIG. 8 shows a simulation result of the relationship between an angle of a dipole magnet and a magnetic field (magnetic flux density) of the magnetization characteristic measuring device using the magnetic field applying mechanism of FIG. 6.

FIG. 8 shows a simulation result of the relationship between the angle of the dipole magnet 131 and the magnetic field (magnetic flux density) of the magnetization characteristic measuring device using the magnetic field applying mechanism 121' of FIG. 6. As shown in FIG. 8, the magnetic field strength can be changed by changing the angle of the dipole magnet.

Third Example

Figure 9:
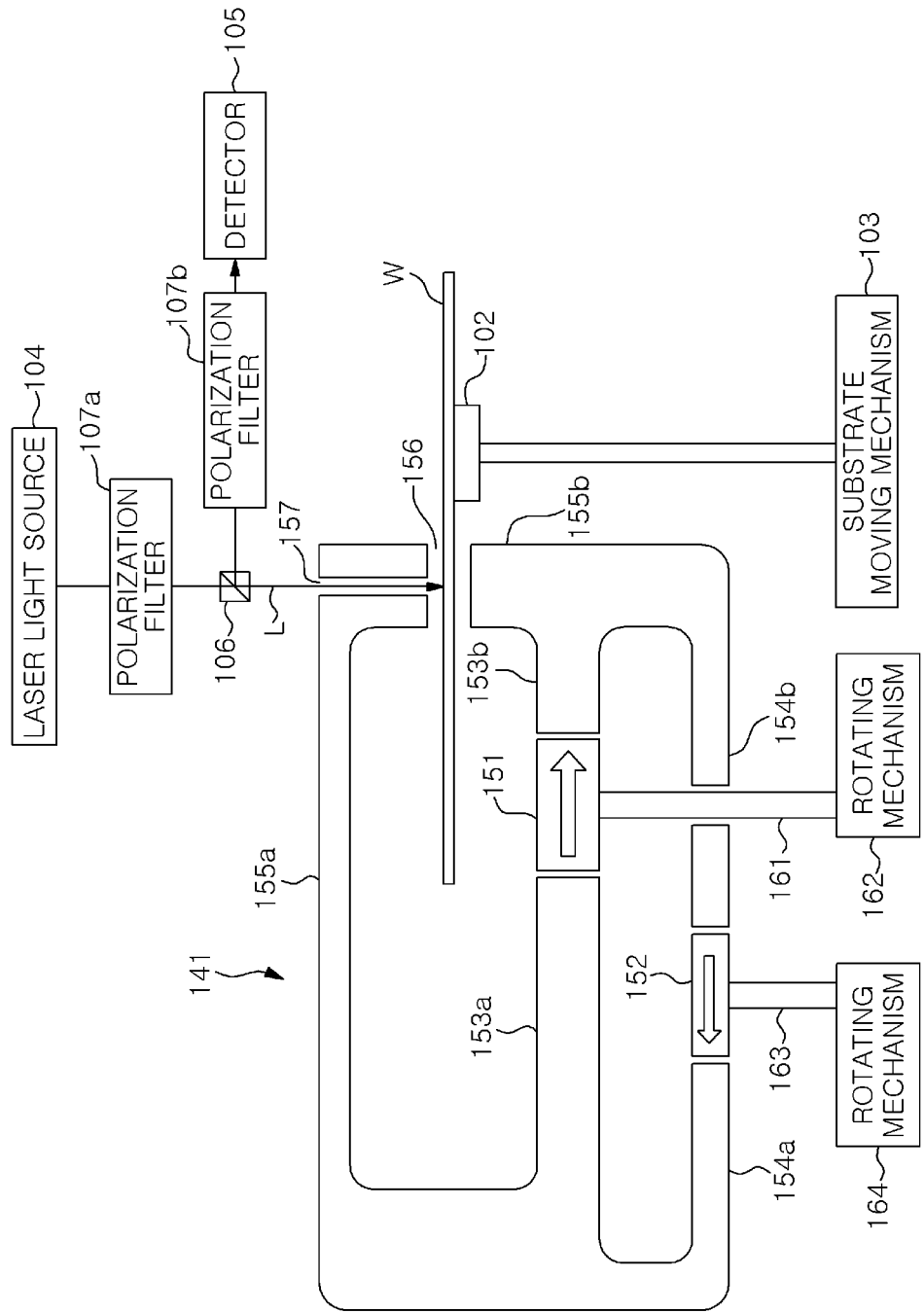
FIG. 9 is a cross-sectional view showing a schematic configuration of a third example of the magnetization characteristic measuring device.

FIG. 9 is a cross-sectional view showing a schematic configuration of a third example of the magnetization characteristic measuring device.

The magnetization characteristic measuring device of the third example includes a magnetic field applying mechanism 141 instead of the magnetic field applying mechanism 101 of the first example. The substrate support 102, the substrate moving mechanism 103, the laser light source 104, and the detector 105 are configured similarly to those of the first example.

The magnetic field applying mechanism 141 is configured to apply a magnetic field of a specific range to the substrate W. The magnetic field applying mechanism 141 includes, as the permanent magnet member that generate a magnetic field, two permanent magnets each of which is configured to adjust magnetic field strength. One permanent magnet has a relatively large magnetic field strength, and the other permanent magnet has a relatively small magnetic field strength. Specifically, the magnetic field applying mechanism 141 includes, as the magnetic-field-strength adjustable magnets, a rotatable first dipole magnet 151 having a relatively large magnetic field strength and a rotatable second dipole magnet 152 having a relatively small magnetic field strength. The magnetic field applying mechanism 141 further includes a plurality of yokes 153a, 153b, 154a, 154b, 155a, 155b that guide magnetic flux from the first dipole magnet 151 and the second dipole magnet 152. A yoke 153a extends from one side of the first dipole magnet 151, a yoke 154a extends from one side of the second dipole magnet 152, and the yoke 153a and the yoke 154a are combined to form a yoke 155a. Further, a yoke 153b extends from the other side of the first dipole magnet 151, a yoke 154b extends from the other side of the second dipole magnet 152, and the yoke 153b and the yoke 154b are combined to form a yoke 155b. A gap 156 is formed between the yoke 155a and the yoke 155b. A magnetic field induced from the first dipole magnet 151 and the second dipole magnet 152 through the aforementioned yokes is applied to the gap 156. That is, the first dipole magnet 151, the second dipole magnet 152, and the plurality of yokes 153a, 153b, 154a, 154b, 155a, 155b constitute the permanent magnet circuit that applies a strength adjusted magnetic field to the substrate W. In the yoke 155a, a hole 157 for guiding the laser light to the substrate W is formed perpendicularly to the substrate W.

The first dipole magnet 151 is connected to a rotating mechanism 162 via a rotating shaft 161 that extends vertically downward therefrom, and is rotatable by the rotating mechanism 162. The second dipole magnet 152 is connected to a rotating mechanism 164 through a rotating shaft 163 that extends vertically downward therefrom, and is rotatable by the rotating mechanism 164. The rotating shaft 161 of the first dipole magnet 151 extends downward through a through-hole formed through the yoke 154b. The rotating mechanisms 162 and 164 are provided outside the chamber. The rotating mechanisms 162 and 164 rotate the first and the second dipole magnet 151 and 152, respectively, to adjust the angles of the first and the second dipole magnet 151 and 152, thereby changing the magnetic field applied to the gap 156.

The first dipole magnet 151 has a relatively large magnetic field strength, and the second dipole magnet 152 has a relatively small magnetic field strength. For example, the first dipole magnet 151 has the magnetic field strength of about 10,000 to 15,000 Oe (oersted), and the second dipole magnet 152 has the magnetic field strength of about 2000 to 4000 Oe.

As described above, by using two rotatable dipole magnets, the first dipole magnet 151 having a relatively large magnetic field strength is used as a magnet for applying a background magnetic field, and the second dipole magnet 152 having a relatively small magnetic field strength is used as a magnet for finely adjusting the magnetic field.

In the third example, in addition to the same effect as in the first example, the above-described configuration is further advantageous in that magnetic fields corresponding to the magnetic films formed on the substrate W can be quickly applied with high accuracy. That is, for example, when the magnetization characteristics of each layer of the MTJ device shown in FIG. 2 are measured, as described with reference to FIG. 4, the magnetic field strengths that cause the distinctive magnetization switching in the pinned layer, the reference layer, and the free layer are different from each other, and the range of the magnetic field strengths covers a wide range from about 0 Oe to a large value of about 10,000 Oe. In view of the above, in the third example, the angle of the first dipole magnet 151 is adjusted depending on the magnetic film to roughly apply the background magnetic field, and the magnetic field is finely adjusted by the second dipole magnet 152 having a relatively small magnetic field strength. Therefore, the magnetic field corresponding to the magnetic film can be applied quickly with high accuracy. Specifically, in the case of the free layer of which the magnetization is easy to reverse due to a low coercive force, the magnetization switching occurs in the vicinity of a magnetic field of 0. Therefore, it is effective to make the background magnetic field almost zero by setting the angle of the first dipole magnet 151 to make a direction of the magnetic poles be perpendicular to the paper surface of FIG. 9 and finely adjust the magnetic field by the second dipole magnet 152. Further, in the case of the pinned layer of which the magnetization is switched in a high magnetic field, it is effective to make the angle of the first dipole magnet 151 close to horizontal and finely adjust the magnetic field by the second dipole magnet 152.

Figure 10:
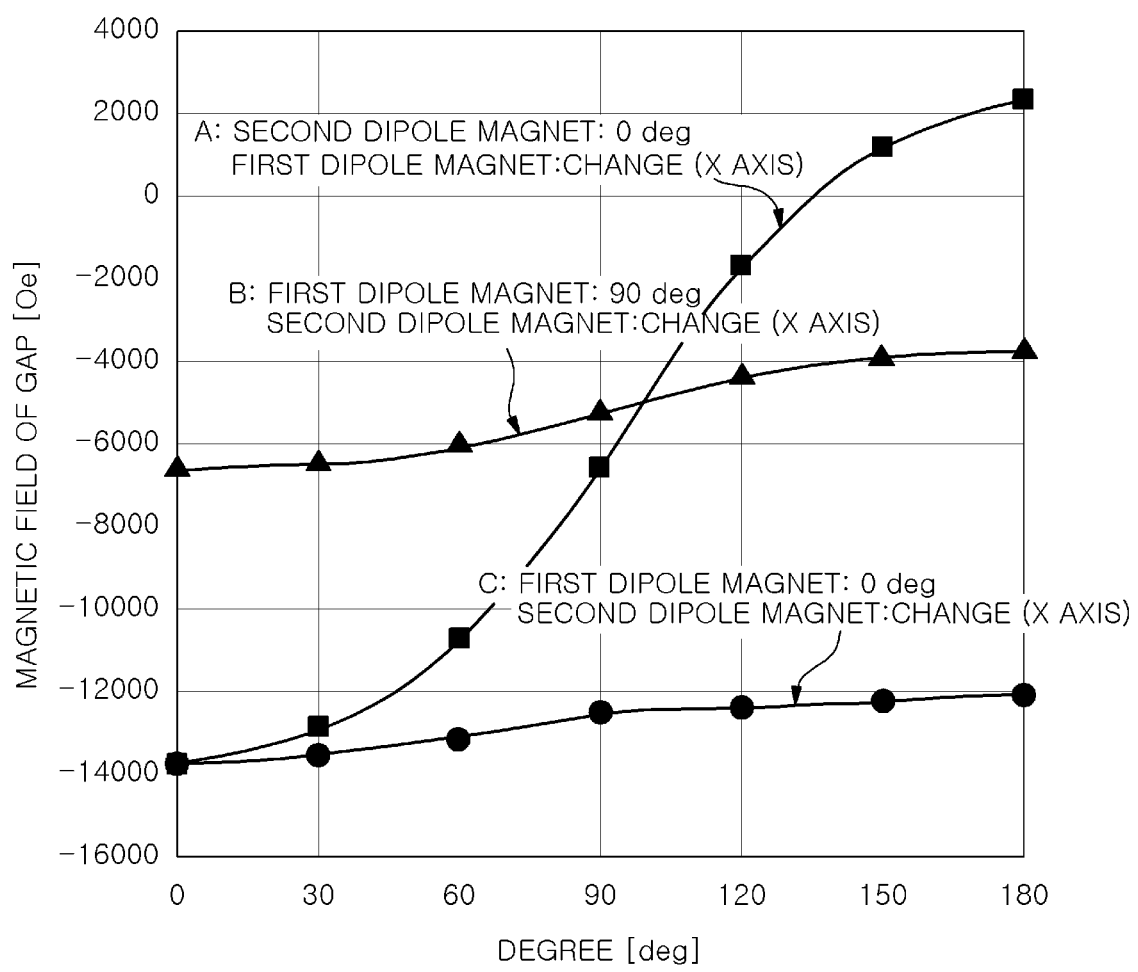
FIG. 10 shows a simulation result when a magnetic field is changed by two dipole magnets.

FIG. 10 shows the simulation result when the magnetic field is changed by the two rotatable dipole magnets. FIG. 10 shows the relationship between the angle and the magnetic field of the gap when the angle of the first dipole magnet having a relatively large magnetic field strength or the second dipole magnet having a relatively small magnetic field strength is changed. In FIG. 10, a reference symbol A indicates a case where the second dipole magnet is fixed to an angle of 0 degree and the angle of the first dipole magnet is changed (that is, X axis indicates the angle of the first dipole magnet). A reference symbol B is a case where the first dipole magnet is fixed to an angle of 90 degrees and the angle of the second dipole magnet is changed (that is, X axis indicates the angle of the second dipole magnet). A reference symbol C is a case where the first dipole magnet is fixed to an angle of 0 degree and the angle of the second dipole magnet is changed (that is, X axis indicates the angle of the second dipole magnet). As shown in FIG. 10, it was found that the magnetic field strength changes significantly when only the first dipole magnet is changed, and the magnetic field strength changes gently with respect to the background magnetic field of the first dipole magnet when only the second dipole magnet is changed.

Further, the two permanent magnets capable of adjusting the magnetic field are not limited to the rotatable dipole magnets, and may be, for example, a combination of a Halbach array magnet and a shunt yoke. Further, when the magnetization characteristics of one magnetic film are measured, the magnetic field of a permanent magnet that applies a background magnetic field and has a relatively large magnetic field strength may be fixed.

Fourth Example

Figure 11:
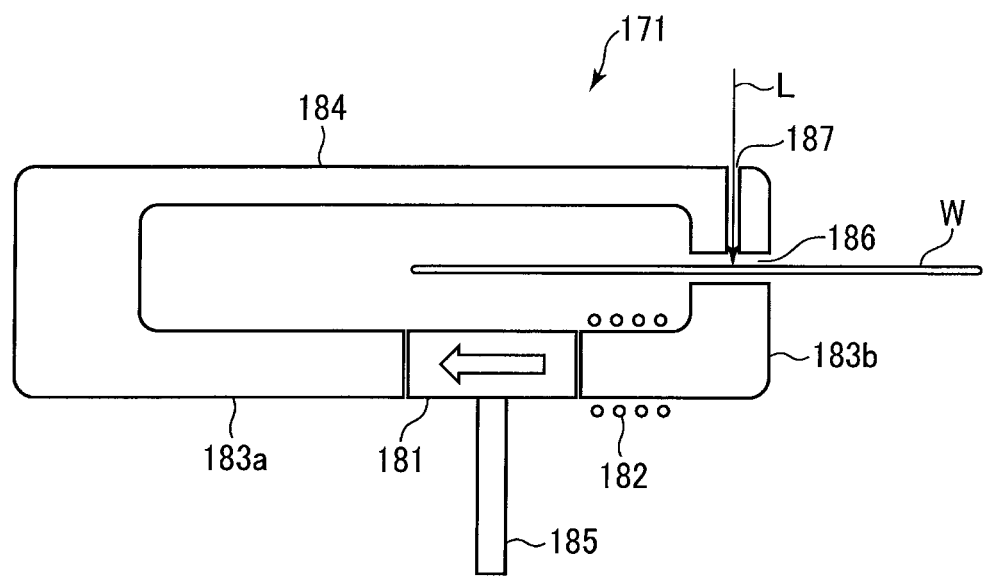
FIG. 11 is a cross-sectional view showing a schematic configuration of a magnetic field applying mechanism in a fourth example of the magnetization characteristic measuring device.

FIG. 11 is a cross-sectional view showing a schematic configuration of a magnetic field applying mechanism in a fourth example of the magnetization characteristic measuring device.

The magnetization characteristic measuring device of the fourth example has a magnetic field applying mechanism 171 in which the second dipole magnet for fine adjustment in the magnetic field applying mechanism 141 of the third example is replaced with a coil. The magnetic field applying mechanism 171 includes a rotatable dipole magnet 181 that is the permanent magnet member that generates a magnetic field, yokes 183a, 183b and 184 that guide magnetic flux from the dipole magnet 181, and a coil 182. A yoke 183a extends from one side of the dipole magnet 181, a yoke 183b extends from the other side of the dipole magnet 181, and a yoke 184 extends from the yoke 183a to the substrate W. The coil 182 is wound around the yoke 183b, and a current is supplied to the coil 182 from a power source (not shown), so that a magnetic field is formed by the current. Thus, the coil 182 serves as an electromagnet. A gap 186 is formed between the yoke 184 and the yoke 183b, and the magnetic field induced from the dipole magnet 181 and the coil 182 is applied to the gap 186. That is, the dipole magnet 181, the yokes 183a, 183b, 184, and the coil 182 constitute the permanent magnet magnetic circuit using an electromagnet as an auxiliary magnet. A hole 187 for guiding the laser light to the substrate W is formed through the yoke 184 perpendicularly to the substrate W.

The dipole magnet 181 is connected to a rotating mechanism (not shown) via a rotating shaft 185 extending vertically downward therefrom, and is rotatable by the rotating mechanism. Further, the dipole magnet 181 has a relatively large magnetic field strength and serves as a background magnet, similar to the first dipole magnet of the third example. Further, by supplying a current to the coil 182, a magnetic field having a relatively small magnetic field strength is generated, similar to the second dipole magnet 152 of the third example.

In the fourth example, although the magnetic field for fine adjustment is generated by the electromagnet using the coil 182, only a small magnetic field strength needs to be generated and, thus, the configuration of the fourth example does not cause the defects such as the requirement of the large space and the magnetic field leakage that may occurs in Japanese Patent Application Publication No. H03-163376 that discloses the case where the electromagnet is merely provided to generate the magnetic field. Further, since the small power may be used for the coil and the heating value of the coil is small, using the electromagnet is not disadvantageous in the fourth example.

Figure 12:
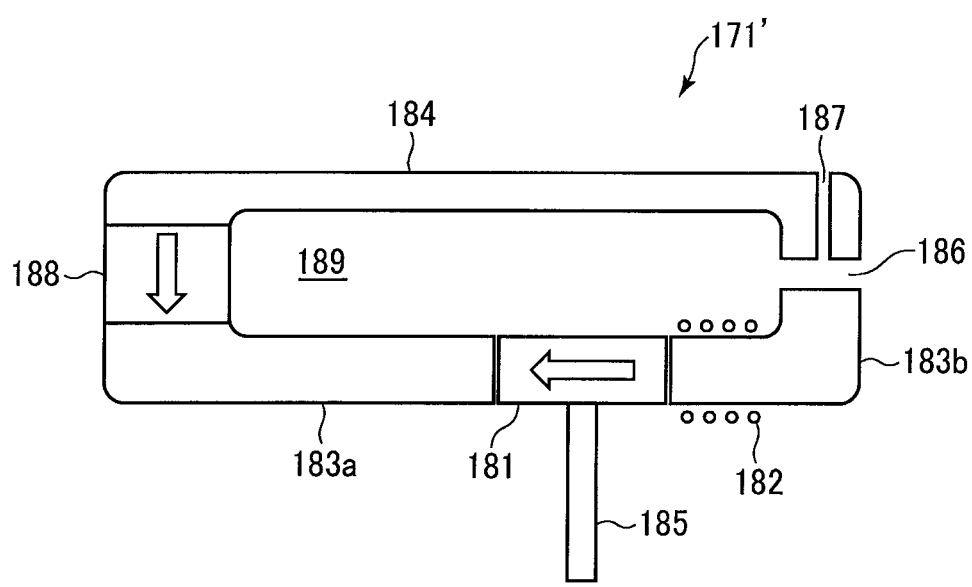
FIG. 12 is a cross-sectional view showing a schematic configuration of a magnetic field applying mechanism used in a modification of the fourth example.

FIG. 12 is a modification of the fourth example and is a cross-sectional view showing a magnetic field applying mechanism 171' in which a biasing permanent magnet 188 is further added to the magnetic field applying mechanism 171 of FIG. 11. The biasing permanent magnet 188 is provided between the yoke 183a and the yoke 184 and has a function of increasing the magnetic field applied to the gap 186. In the permanent magnet magnetic circuit as shown in FIG. 11, the magnetic field applied to the gap 186 has a limit of about 15 kOe. However, when a larger magnetic field is required for the magnetization characteristic measurement, it is effective to provide the biasing permanent magnet 188 as shown in FIG. 12. However, with such a configuration, when the background magnetic field is small, the magnetic field leakage of an inner space 189 becomes large.

Fifth Example

Figure 13:
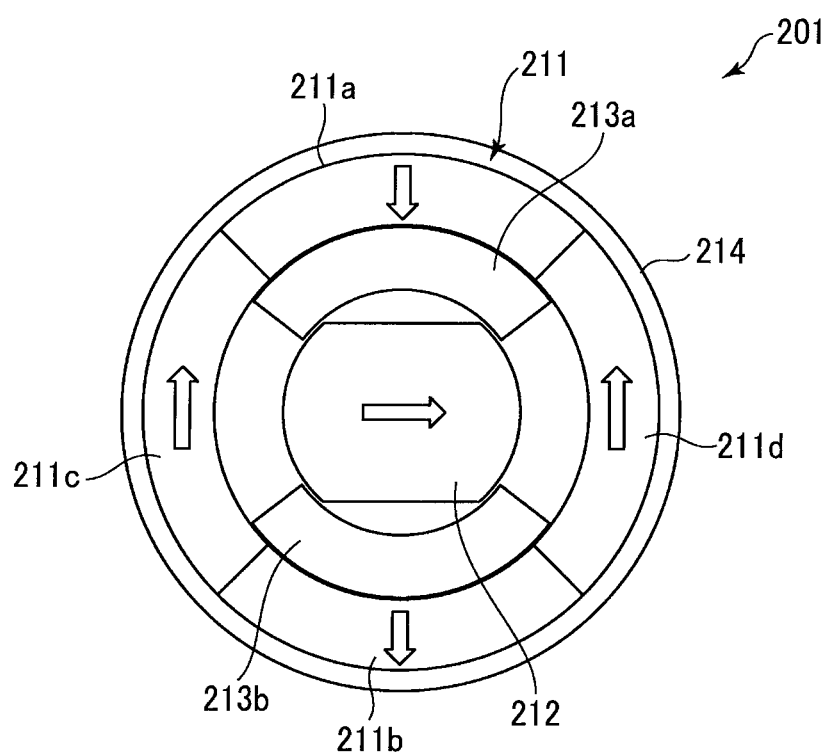
FIG. 13 is a cross-sectional view showing a schematic configuration of a magnetic field applying mechanism in a fifth example of the magnetization characteristic measuring device.

FIG. 13 is a cross-sectional view showing a schematic configuration of a magnetic field applying mechanism in a fifth example of the magnetization characteristic measuring device.

The magnetic property measuring device of the fifth example is configured similarly to that of the first example except that the magnetic property measuring device of the fifth example includes a magnetic field applying mechanism 201 instead of the magnetic field applying mechanism 101 of the first example.

The magnetic field applying mechanism 201 of the fifth example includes an outer dipole magnet 211, an inner dipole magnet 212, and a pair of yokes 213a and 213b. The outer dipole magnet 211 and the inner dipole magnet 212 are concentrically arranged and respectively rotatable by rotating mechanisms (not shown) via shafts (not shown). The yokes 213a and 213b extend upward from (perpendicular to) the paper surface of FIG. 13, and a gap (not shown) is formed between the ends of the yokes 213a and 213b. A magnetic field induced from the outer dipole magnet 211 and the inner dipole magnet 212 via the yokes 213a and 213b is applied to the gap. That is, the outer dipole magnet 211, the inner dipole magnet 212, and the yokes 213a and 213b constitute the permanent magnet magnetic circuit. Further, an annular yoke 214 for suppressing the magnetic field leakage is disposed outside the outer dipole magnet 211.

Similar to the first example, a substrate is inserted into the gap, the substrate is irradiated with laser light, and the Kerr rotation angle, which is the rotation angle of the polarization plane of the reflected light, is detected by a detector to measure the magnetization characteristics of the magnetic films formed on the substrate.

The outer dipole magnet 211 and the inner dipole magnet 212 are respectively rotated by the rotating mechanisms, so that the angles of the outer dipole magnet 211 and the inner dipole magnet 212 are adjusted. Accordingly, the magnetic field applied from each of the magnets 211 and 212 to the gap can be changed.

The outer dipole magnet 211 has a relatively large magnetic field strength, and the inner dipole magnet 212 has a relatively small magnetic field strength. For example, the outer dipole magnet 211 has the magnetic field strength of about 10,000 to 15,000 Oe, and the inner dipole magnet 212 has the magnetic field strength of about 2000 to 4000 Oe. The outer dipole magnet 211 preferably has two or more magnet pieces in order to increase the magnetic flux induced in the yokes 213a and 213b. In the illustrated example, the outer dipole magnet 211 has four magnet pieces 211a, 211b, 211c and 211d. The inner dipole magnet 212 has one magnet piece. However, the inner dipole magnet 212 may have a plurality of magnet pieces.

As described above, by using two rotatable dipole magnets, the outer dipole magnet 211 having a relatively large magnetic field strength is used as a magnet for applying a background magnetic field, and the inner dipole magnet 212 having a relatively small magnetic field strength is used as a magnet for finely adjusting the magnetic field. As a result, similar to the third example, the magnetic fields corresponding to the magnetic films formed on the substrate can be applied quickly with high accuracy. Further, the two concentric magnets are arranged, so that the space saving can be achieved and a very compact magnetization characteristic measuring device can be obtained.

Sixth Example

Figure 14:
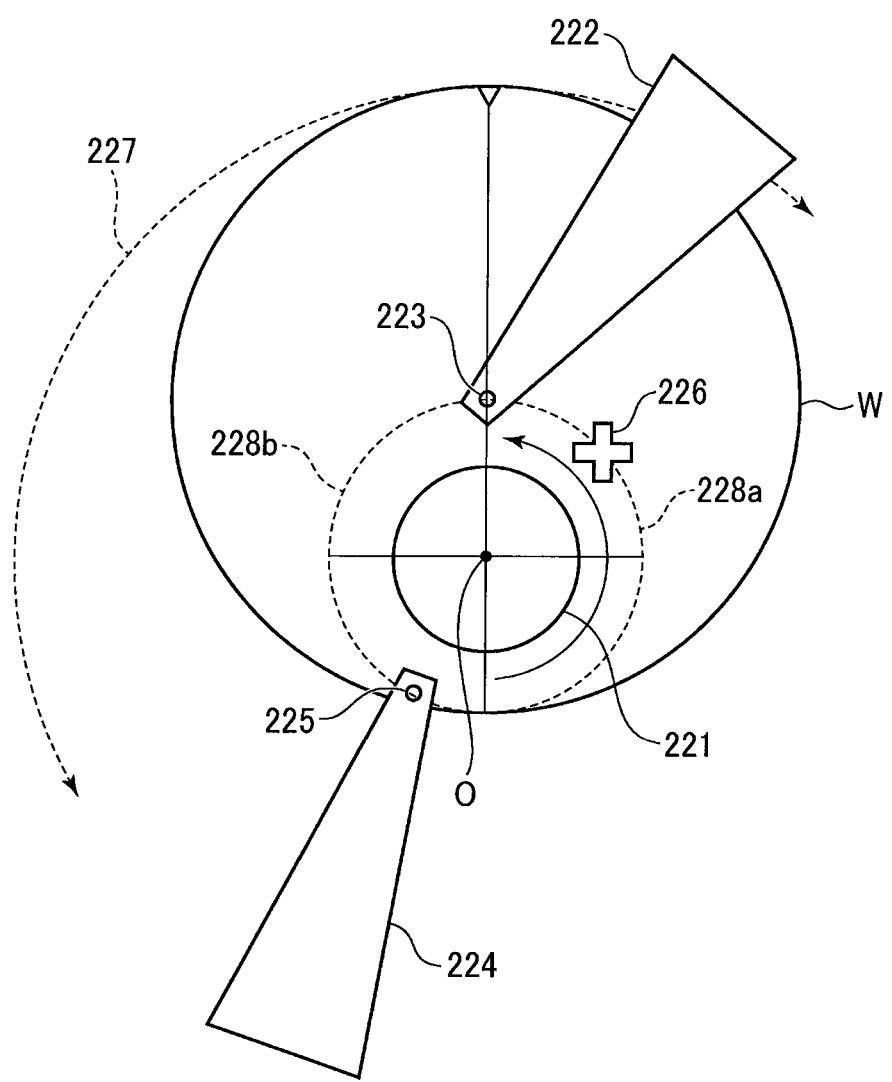
FIG. 14 is a plan view showing a schematic configuration of a sixth example of the magnetization characteristic measuring device.

FIG. 14 is a plan view showing a schematic configuration of a sixth example of the magnetization characteristic measuring device.

In the sixth example, examples of the arrangement of the substrate, the movement of the substrate, and the arrangement of the device are described. Although the film forming process in the film forming system 1 is performed by sputtering, the sputtering is performed while rotating the substrate W in order to obtain uniform film thickness. Therefore, the non-uniformity of the characteristics of the substrate W mainly appears in the radial direction. In view of the above, in the sixth example, there is suggested a configuration in which the magnetization characteristics of a plurality of points in the radial direction of the substrate W can be easily measured.

The magnetization characteristic measuring device of the sixth example includes a substrate support 221 for placing thereon the substrate W, a rotating mechanism (not shown) for rotating the substrate support 221, a first magnetic field applying mechanism 222, a second magnetic field applying mechanism 224, and optical systems each including a light source and detectors (all not shown) respectively provided for the first and the magnetic field applying mechanism 222 and 224, and a demagnetization device 226. In the sixth example, a semiconductor wafer is used as the substrate W.

The first magnetic field applying mechanism 222 has a gap 223 near the center of the substrate W. The second magnetic field applying mechanism 224 has a gap 225 near the periphery of the substrate W. As examples of the first magnetic field applying mechanism 222 and the second magnetic field applying mechanism 224, any one of the magnetic field applying mechanisms described in the first to fifth examples can be used.

The substrate support 221 supports the substrate W so that its center O is offset from the center of the substrate W. The substrate support 221 may have an electrostatic chuck that electrostatically attracts and holds the substrate W. When the substrate support 221 is rotated while the substrate W is supported by the substrate support 221 in such an offset state, the outer periphery of the substrate W moves along a dotted line 227. Thus, the position of the substrate W that passes through the gap 223 moves along a dotted line 228a, and the position of the substrate W that passes through the gap 225 moves along a dotted line 228b. In other words, it is possible to measure the magnetization characteristics at an arbitrary position in the radial direction of the substrate W without using a complicated mechanism such as an XY stage.

The first magnetic field applying mechanism 222 and the second magnetic field applying mechanism 224 can be selectively and distinctively used depending on the characteristics of the magnetic film whose magnetization characteristics are to be measured. For example, the first magnetic field applying mechanism 222 is configured to apply a large magnetic field to be used for the measurement of a magnetic film such as the pinned layer requiring a large magnetic field, and the second magnetic field applying mechanism 224 is used for the measurement of a magnetic film such as the free layer requiring a small magnetic field.

Before the magnetization characteristics are measured, the pinned layer is magnetized, for example. Thus, it is difficult to set the magnetization of the pinned layer in the direction required for the magnetization characteristic measurement with the magnetic field strength of the magnetic field applying mechanism described above. Therefore, the demagnetization device 226 is provided on the movement path of the position of the substrate W passing through the gap 223 indicated by the dotted line 228a to demagnetize the magnetic film, thereby making it possible to measure the magnetization characteristics.

Figure 15:
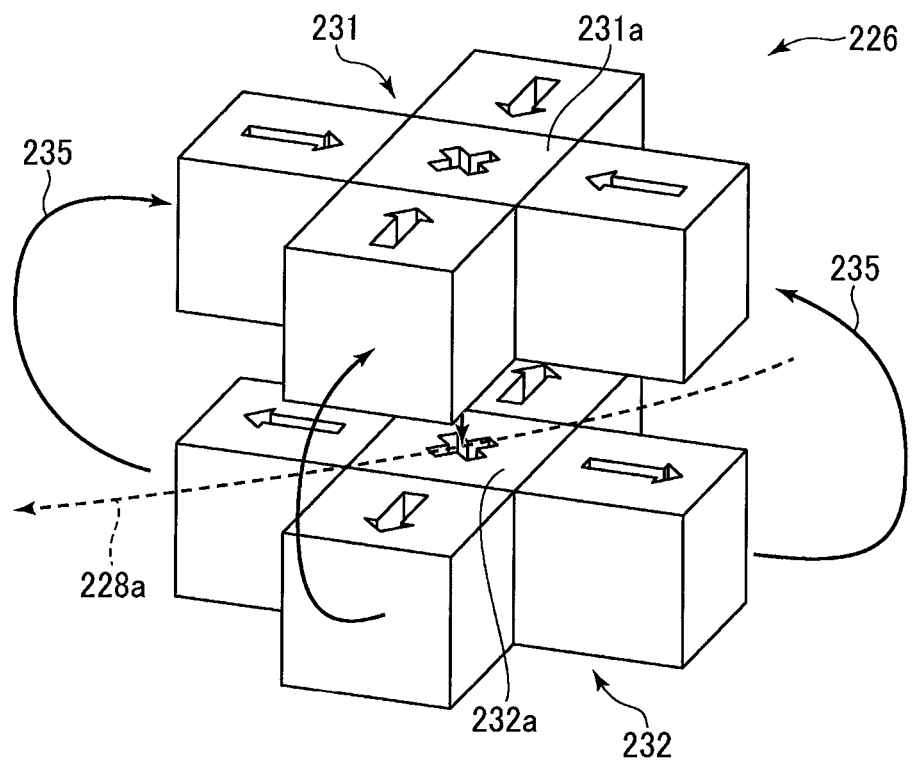
FIG. 15 is a perspective view showing a demagnetization device used in the magnetization characteristic measuring device of FIG. 14.

As shown in FIG. 15, the demagnetization device 226 includes a pair of Halbach array magnets 231 and 232, and the substrate W passes through between the Halbach array magnets 231 and 232. Each of the Halbach array magnets 231 and 232 includes five permanent magnets. For example, a gap of 5 mm is formed and a large magnetic field of 15.4 kOe is applied from a central magnet 231a of the Halbach array magnet 231 to a central magnet 232a of the Halbach array magnet 232. Therefore, before the magnetic field is applied to a certain position of the substrate W on the dotted line 228a by the first magnetic field applying mechanism 222, the magnetization at that position can be demagnetized by the demagnetization device 226. However, as shown in FIG. 15, a return magnetic field 235 in the direction opposite to the demagnetizing magnetic field is generated around the demagnetizing magnetic field generated between the central magnets 231a and 232a. Therefore, it is necessary to dispose the demagnetization device 226 such that the movement path indicated by the dotted line 228a is not located in the return magnetic field 235.

Other Applications

While the embodiments have been described, the presently disclosed embodiments are considered in all respects to be illustrative and not restrictive. The above-described embodiments may be omitted, replaced, or changed in various forms without departing from the scope of the appended claims and the gist thereof.

For example, the film forming system 1 of the embodiments is merely an example, and any system may be employed as long as a processing module for forming a magnetic film and a magnetization characteristic measuring device are incorporated and the magnetization characteristics can be measured in situ in the system.

Further, the magnetization characteristic measuring device is not limited to that of the above-described embodiments, and the magnetic field applying mechanism may be any mechanism that has a permanent magnet member and a mechanism capable of adjusting a magnetic field applied from the permanent magnet member to the substrate. Further, the mechanism for measuring the magnetization is not limited to the mechanism using the Kerr effect.

Further, although the substrate moving mechanism that rotates the substrate has been illustrated, the present disclosure is not limited thereto and another moving mechanism that linearly moves the substrate may be used.

What is claimed is:

1. A film forming system for forming a magnetic film, comprising:
   a processing module configured to form the magnetic film on a substrate;
   a magnetization characteristic measuring device configured to measure magnetization characteristics of the magnetic film formed on the substrate in the processing module; and a transfer unit configured to transfer the substrate between the processing module and the magnetization characteristic measuring device, wherein the magnetization characteristic measuring device includes a magnetic field applying mechanism having a permanent magnet magnetic circuit configured to apply a magnetic field to the substrate and adjust the magnetic field to be applied to the substrate, and a detector configured to detect magnetization characteristics of the substrate.

2. The film forming system of claim 1, further comprising:
a processing module group including the processing module configured to form the magnetic film and another processing module configured to form a different film or perform a process accompanying the film formation.

3. The film forming system of claim 1, wherein the magnetization characteristic measuring device further includes an optical system configured to irradiate a magnetic field application portion of the substrate with light, and the detector detects the magnetization characteristics through a rotation of a polarization plane due to a magneto-optical effect of a reflected light of the light irradiated to the substrate.

4. The film forming system of claim 1, wherein the permanent magnet magnetic circuit includes a permanent magnet, a yoke made of a magnetic material configured to guide a magnetic flux from the permanent magnet to the substrate, and an adjustment mechanism configured to adjust the magnetic field to be applied to the substrate.

5. The film forming system of claim 4, wherein the permanent magnet is a Halbach array magnet, and the adjustment mechanism includes a shunt yoke and a moving mechanism configured to move the shunt yoke.

6. The film forming system of claim 4, wherein the permanent magnet is a dipole magnet, and the adjustment mechanism is a rotating mechanism configured to rotate the dipole magnet to adjust an angle of magnetic poles.

7. The film forming system of claim 4, wherein the permanent magnet magnetic circuit includes a first magnetic field applying mechanism made of the permanent magnet and a second magnetic field applying mechanism having a magnetic field strength smaller than that of the first magnetic field applying mechanism, and
a background magnetic field is applied to the substrate by the first magnetic field applying mechanism, and the adjustment mechanism adjusts at least the magnetic field to be applied to the substrate from the second magnetic field applying mechanism.

8. The film forming system of claim 7, wherein the first magnetic field applying mechanism is a first dipole magnet having a relatively large magnetic field strength, and the second magnetic field applying mechanism is a second dipole magnet having a relatively small magnetic field strength, and
the adjustment mechanism includes a first rotating mechanism configured to rotate the first dipole magnet to adjust an angle of magnetic poles and a second rotating mechanism configured to rotate the second dipole magnet to adjust an angle of magnetic poles.

9. The film forming system of claim 8, wherein the first dipole magnet is arranged concentrically around the second dipole magnet.

10. The film forming system of claim 7, wherein the second magnetic field applying mechanism has a coil wound around the yoke and serves as an electromagnet by supplying current to the coil.

11. A magnetization characteristic measuring device for measuring magnetization characteristics of a magnetic film formed on a substrate in a processing module provided in a film forming system, comprising:
a magnetic field applying mechanism having a permanent magnet magnetic circuit configured to apply a magnetic field to the substrate and adjust the magnetic field to be applied to the substrate, and
a detector configured to detect magnetization characteristics of the substrate.

12. The magnetization characteristic measuring device of claim 11, further comprising:
an optical system configured to irradiate a magnetic field application portion of the substrate with light, and the detector detects the magnetization characteristics through a rotation of a polarization plane due to a magneto-optical effect of a reflected light of the light irradiated to the substrate.

13. The magnetization characteristic measuring device of claim 11, wherein the permanent magnet magnetic circuit includes a permanent magnet, a yoke made of a magnetic material configured to guide a magnetic flux from the permanent magnet to the substrate, and an adjustment mechanism configured to adjust the magnetic field to be applied to the substrate.

14. The magnetization characteristic measuring device of claim 13, wherein the permanent magnet is a Halbach array magnet, and the adjustment mechanism includes a shunt yoke and a moving mechanism configured to move the shunt yoke.

15. The magnetization characteristic measuring device of claim 13, wherein the permanent magnet is a dipole magnet, and the adjustment mechanism is a rotating mechanism configured to rotate the dipole magnet to adjust an angle of magnetic poles.

16. The magnetization characteristic measuring device of claim 13, wherein the permanent magnet magnetic circuit includes a first magnetic field applying mechanism made of the permanent magnet and a second magnetic field applying mechanism having a magnetic field strength smaller than that of the first magnetic field applying mechanism, and
a background magnetic field is applied to the substrate by the first magnetic field applying mechanism, and the adjustment mechanism adjusts at least the magnetic field to be applied to the substrate from the second magnetic field applying mechanism.

17. The magnetization characteristic measuring device of claim 16, wherein the first magnetic field applying mechanism is a first dipole magnet having a relatively large magnetic field strength, and the second magnetic field applying mechanism is a second dipole magnet having a relatively small magnetic field strength, and
the adjustment mechanism includes a first rotating mechanism configured to rotate the first dipole magnet to adjust an angle of magnetic poles and a second rotating mechanism configured to rotate the second dipole magnet to adjust an angle of magnetic poles.

18. The magnetization characteristic measuring device of claim 17, wherein the first dipole magnet is arranged concentrically around the second dipole magnet.

19. The magnetization characteristic measuring device of claim 16, wherein the second magnetic field applying mechanism has a coil wound around the yoke and serves as an electromagnet by supplying current to the coil.

20. A film forming method for forming a magnetic film by a film forming system including a processing module for forming the magnetic film; a magnetization characteristic measuring device for measuring magnetization characteristics of the magnetic film formed in the processing module; and a transfer unit for transferring a substrate between the processing module and the magnetization characteristic measuring device, the film forming method comprising:
  forming the magnetic film in the processing module;
  applying, in the magnetization characteristic measuring device, a magnetic field to the substrate by a magnetic field applying mechanism having a permanent magnet magnetic circuit configured to adjust the magnetic field to be applied to the substrate; and
  detecting, in the magnetization characteristic measuring device, magnetization characteristics of the substrate to which the magnetic field is applied by a detector.

* * * * *